United States Patent
Morimoto et al.

(10) Patent No.: US 10,283,651 B2
(45) Date of Patent: May 7, 2019

(54) PHOTODETECTION DEVICE AND SYSTEM HAVING AVALANCHE AMPLIFICATION

(71) Applicant: CANON KABUSHIKI KAISHA, Tokyo (JP)

(72) Inventors: Kazuhiro Morimoto, Neuchâtel (CH); Hajime Ikeda, Yokohama (JP); Junji Iwata, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/821,264

(22) Filed: Nov. 22, 2017

(65) Prior Publication Data

US 2018/0151758 A1    May 31, 2018

(30) Foreign Application Priority Data

Nov. 29, 2016 (JP) ................. 2016-231768

(51) Int. Cl.

| | | |
|---|---|---|
| *H01L 31/02* | (2006.01) | |
| *H01L 31/113* | (2006.01) | |
| *H01L 31/0352* | (2006.01) | |
| *G01S 17/93* | (2006.01) | |
| *G01S 17/08* | (2006.01) | |
| *G01S 7/486* | (2006.01) | |
| *G01S 17/10* | (2006.01) | |

(52) U.S. Cl.
CPC ...... *H01L 31/02027* (2013.01); *G01S 7/4863* (2013.01); *G01S 7/4865* (2013.01); *G01S 17/08* (2013.01); *G01S 17/10* (2013.01); *G01S 17/936* (2013.01); *H01L 31/03529* (2013.01); *H01L 31/1136* (2013.01)

(58) Field of Classification Search
CPC ................................ H01L 31/02027
See application file for complete search history.

(56) References Cited

U.S. PATENT DOCUMENTS 4,622,571 A * 11/1986 Hara ............. H01L 27/0921
                                                257/372
6,392,282 B1 * 5/2002 Sahara ............ H01L 27/1443
                                                257/186

FOREIGN PATENT DOCUMENTS

| JP | H03-62977 A | 3/1991 |
|---|---|---|
| JP | 2008-288326 A | 11/2008 |

* cited by examiner

*Primary Examiner* — Edwin C Gunberg
(74) *Attorney, Agent, or Firm* — Canon U.S.A., Inc. IP Division

(57) ABSTRACT

A photodetection device includes a semiconductor substrate; and a pixel including a first semiconductor region having signal charges as majority carriers, and an electrode disposed on the semiconductor substrate with a dielectric member interposed therebetween. The pixel is configured to detect a signal based on avalanche-amplified electric charges. A quenching circuit configured to suppress a current generated by the avalanche amplification is connected to the first semiconductor region. A second semiconductor region of a conductive type opposite that of the first semiconductor region is disposed under the electrode and in a front surface of the semiconductor substrate. When a predetermined potential is supplied to the electrode, an inversion layer is formed in the second semiconductor region, and the inversion layer is electrically connected to the first semiconductor region.

20 Claims, 14 Drawing Sheets

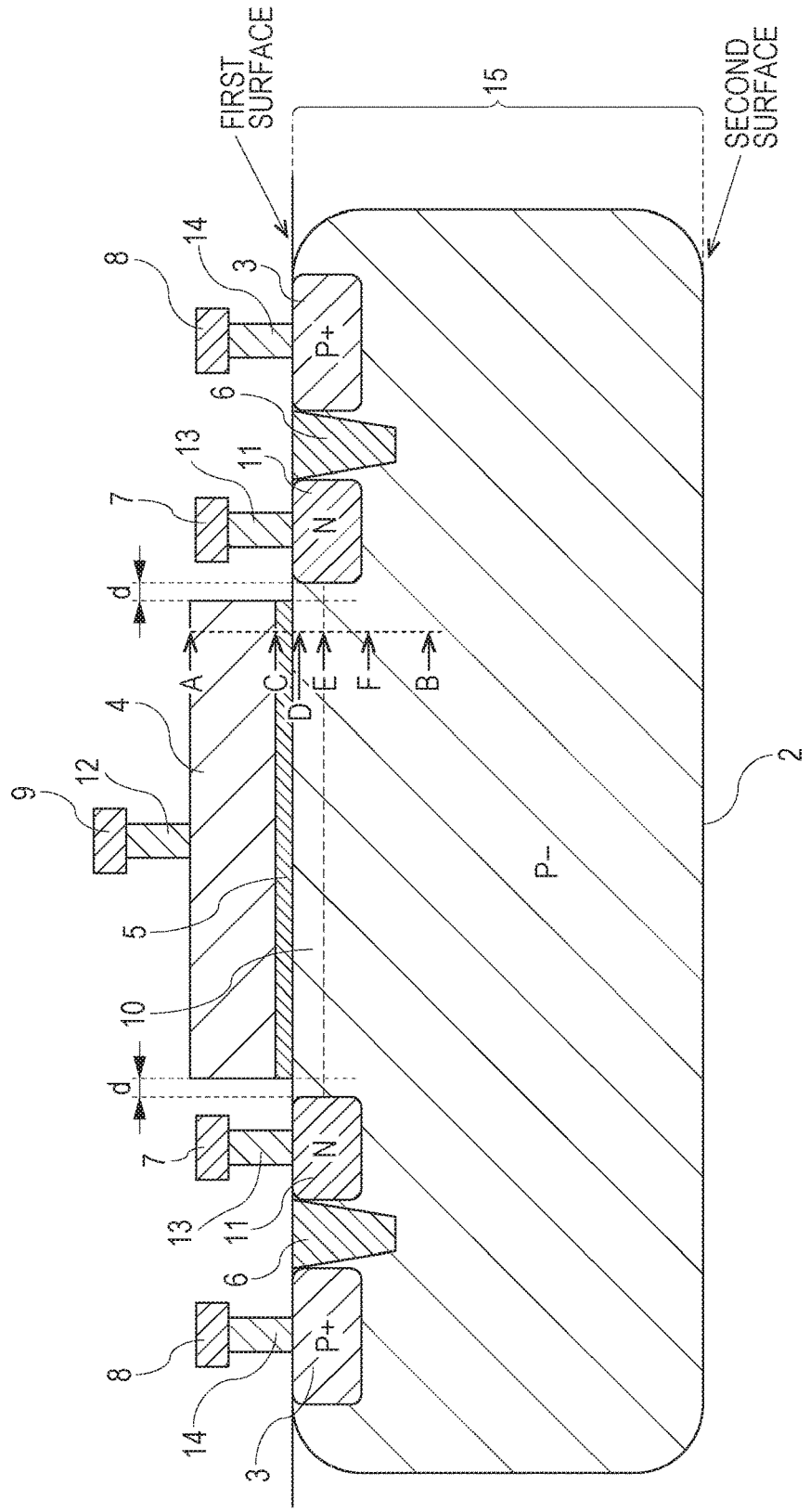

PHOTODETECTION DEVICE AND SYSTEM HAVING AVALANCHE AMPLIFICATION

BACKGROUND OF THE INVENTION

Field of the Invention

One disclosed aspect of the embodiments relates to a photodetection device and a photodetection system that perform photoelectric conversion.

Description of the Related Art

Photodetection devices that are capable of detecting weak single-photon-level light using electron avalanche multiplication have been known.

Japanese Patent Laid-Open No. 2008-288326 discloses a photodetection device that includes a photoelectric converter, an amplifying region configured to amplify electric charges generated in the photoelectric converter, a transfer gate electrode configured to control transfer of electric charges from the amplifying region to a floating diffusion (FD) region, and a multiplier gate electrode disposed between the photoelectric converter and the transfer gate electrode.

In the photodetection device disclosed in Japanese Patent Laid-Open No. 2008-288326, a potential of the same level as that for turning on a metal oxide semiconductor (MOS) transistor is supplied to the multiplier gate electrode to induce a strong electric field in a semiconductor substrate under the multiplier gate electrode, and thereby avalanche-amplify electric charges accumulated in the photoelectric converter. The avalanche-amplified electric charges are transferred by the transfer gate electrode to the FD region.

With the photodetection device described in Japanese Patent Laid-Open No. 2008-288326, it is difficult to maintain an electric field that is strong enough to produce avalanche amplification in the semiconductor region under the multiplier gate electrode. When a potential of the same level as that for turning on the MOS transistor is supplied to the multiplier gate electrode as a potential for maintaining avalanche amplification, an inversion layer is formed under the multiplier gate electrode after the elapse of a certain period of time. Due to an electric field shielding effect caused by the inversion layer formed under the multiplier gate electrode, the electric field induced in the semiconductor substrate may be weakened.

SUMMARY OF THE INVENTION

An aspect of the embodiments provides a photodetection device capable of maintaining an electric field that is strong enough to produce avalanche amplification in a semiconductor region under a gate electrode.

A photodetection device according to an aspect of the embodiments includes a semiconductor substrate; and a pixel including a first semiconductor region having signal charges as majority carriers, and an electrode disposed on the semiconductor substrate with a dielectric member interposed therebetween. The pixel is configured to detect a signal based on avalanche-amplified electric charges. A quenching circuit configured to suppress a current generated by the avalanche amplification is connected to the first semiconductor region. A second semiconductor region of a conductive type opposite that of the first semiconductor region is disposed under the electrode and in a front surface of the semiconductor substrate. When a predetermined potential is supplied to the electrode, an inversion layer is formed in the second semiconductor region, and the inversion layer is electrically connected to the first semiconductor region.

Further features of the disclosure will become apparent from the following description of exemplary embodiments with reference to the attached drawings.

BRIEF DESCRIPTION OF THE DRAWINGS

FIG. 4 is a schematic cross-sectional view of the photoelectric converter illustrated in FIG. 3.

DESCRIPTION OF THE EMBODIMENTS

Figure 1:
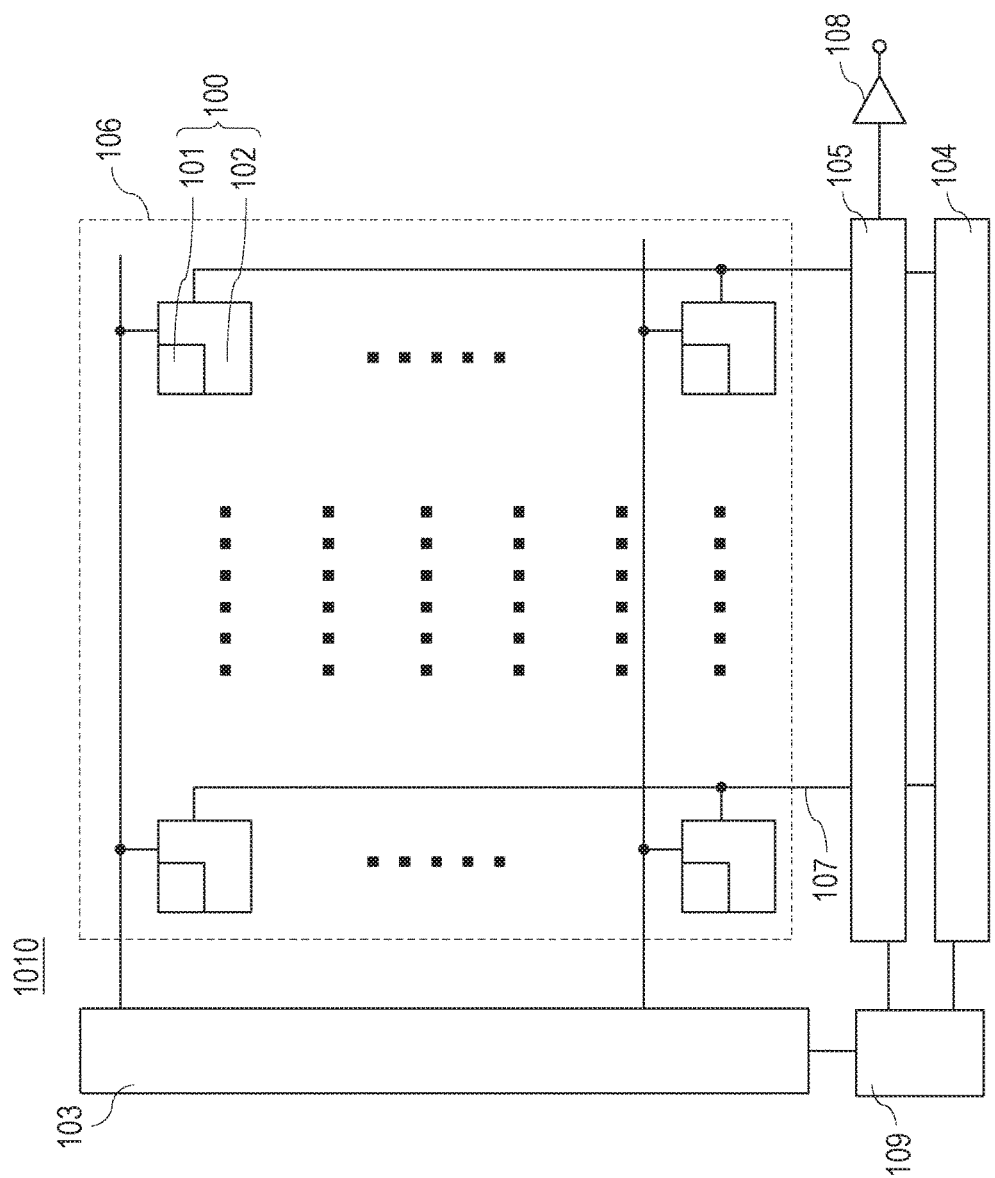
FIG. 1 is a block diagram of a photodetection device according to an embodiment.

A photodetection device of the present embodiment uses pixels for detecting signals based on avalanche-amplified electric charges. FIG. 1 is a block diagram of a photodetection device 1010 according to the present embodiment. The photodetection device 1010 includes a pixel unit 106, a control pulse generating unit 109, a horizontal scanning circuit unit 104, a column circuit 105, signal lines 107, and a vertical scanning circuit unit 103.

The pixel unit 106 includes a plurality of pixels 100 arranged in rows and columns. Each pixel 100 includes a light receiving unit 101 including a photoelectric converter 201 (see FIG. 2), and a pixel signal processing unit 102. The photoelectric converter 201 converts light to an electric signal, and the pixel signal processing unit 102 outputs the electric signal to the column circuit 105.

The vertical scanning circuit unit 103 receives a control pulse supplied from the control pulse generating unit 109, and supplies the control pulse to each pixel 100. A logic circuit, such as a shift register or an address decoder, is used as the vertical scanning circuit unit 103.

The signal lines 107 supply, to a circuit downstream of the pixels 100, signals output from pixels 100 selected by the vertical scanning circuit unit 103 as potential signals.

Signals of the pixels 100 are input through the signal lines 107 to the column circuit 105, which performs predetermined processing on the input signals. The predetermined processing involves removing noise from and amplifying the input signals, and thereby converting them into a form appropriate for output to the outside of the photodetection device 1010. For example, the column circuit 105 includes a parallel-serial conversion circuit.

The horizontal scanning circuit unit 104 supplies, to the column circuit 105, control pulses for sequentially outputting the signals processed by the column circuit 105 to an output circuit 108.

The output circuit 108 includes, for example, a buffer amplifier and a differential amplifier. The output circuit 108 outputs the signals from the column circuit 105 to a recording unit or signal processing unit outside the photodetection device 1010.

The pixel unit 106 may be formed by a plurality of pixels 100 one-dimensionally arranged as in FIG. 1, or may be formed only by a single pixel 100. The vertical scanning circuit unit 103, the horizontal scanning circuit unit 104, and the column circuit 105 may be arranged for each block of pixel columns of the pixel unit 106, or may be arranged for each pixel column of the pixel unit 106.

The function of the pixel signal processing unit 102 does not necessarily need to be provided for every pixel 100. For example, one pixel signal processing unit 102 may be shared by a plurality of pixels 100 and configured to sequentially perform signal processing. For an improved aperture ratio of the photoelectric converter 201, the pixel signal processing unit 102 may be disposed on a semiconductor substrate different from that having the photoelectric converter 201 thereon. In this case, the photoelectric converter 201 and the pixel signal processing unit 102 are connected through a conductive connection line provided for each pixel 100. The vertical scanning circuit unit 103, the horizontal scanning circuit unit 104, the signal lines 107, and the column circuit 105 may also be disposed on the different semiconductor substrate.

Figure 2:
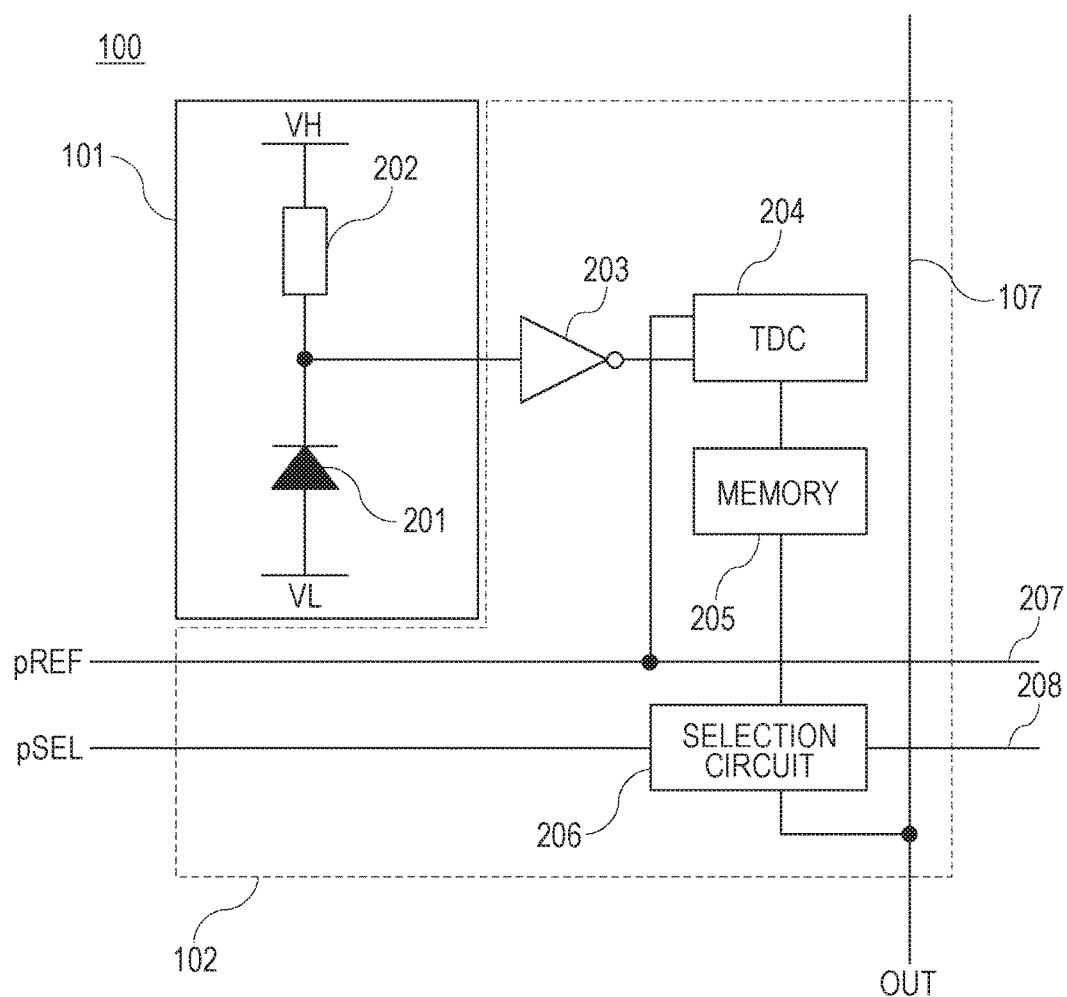
FIG. 2 is a block diagram of a pixel including an equivalent circuit according to the embodiment.

FIG. 2 is a block diagram of the pixel 100, including an equivalent circuit, according to the present embodiment. Referring to FIG. 2, the pixel 100 includes the light receiving unit 101 and the pixel signal processing unit 102. The light receiving unit 101 includes the photoelectric converter 201 and a quenching circuit 202.

The photoelectric converter 201 performs photoelectric conversion to generate electric charge pairs corresponding to incident light. The photoelectric converter 201 avalanche-amplifies signal charges. For example, an avalanche diode is used as the photoelectric converter 201.

A potential based on a potential VH higher than a potential VL supplied to the anode of the photoelectric converter 201 is supplied to the cathode of the photoelectric converter 201. Potentials are supplied to the anode and cathode of the photoelectric converter 201 such that the photoelectric converter 201 is reverse-biased to serve as an avalanche diode. By performing photoelectric conversion while such reverse bias potentials are being supplied, electric charges generated by incident light are avalanche-amplified to generate an avalanche current.

When the reverse bias potentials are supplied, if the potential difference between the anode and the cathode of the photoelectric converter 201 is higher than a breakdown voltage, the avalanche diode operates in Geiger mode. A photodiode capable of quickly detecting weak single-photon-level signals using a Geiger mode operation is a single photon avalanche diode (SPAD).

If the potential difference between the anode and the cathode of the photoelectric converter 201 is higher than or equal to a potential difference that causes electric charges generated in the photoelectric converter 201 to be avalanche-amplified, and lower than or equal to a breakdown voltage, then the avalanche diode operates in linear mode. An avalanche diode that performs photodetection in linear mode is referred to as an avalanche photodiode (APD). SPADs and APDs are collectively referred to as avalanche diodes.

Specifically, a potential difference between an N-type semiconductor region 11 and a P-type semiconductor region 2 (see FIGS. 3 and 4) which allows the photoelectric converter 201 to implement the operation of the avalanche diode is 6 V or higher.

When an impurity concentration (described below) is taken into account, the potential difference between the N-type semiconductor region 11 and the P-type semiconductor region 2 more preferably ranges from 10 V to 30 V. If the potential difference is 10 V or higher, the avalanche diode operates as an SPAD, and if the potential difference is 30 V or lower, a device breakdown is less likely to occur. In this case, for example, a potential of 13 V is supplied to the N-type semiconductor region 11 and a potential of 0 V is supplied to the P-type semiconductor region 2. The potentials are not limited to these values as long as the potential difference is 6 V or higher.

A supply voltage (potential) VH is supplied to the quenching circuit 202, which is connected to the photoelectric converter 201. The quenching circuit 202 functions as a load circuit during avalanche amplification of signals so as to suppress a voltage supplied to the photoelectric converter 201, and thereby suppresses avalanche amplification (quenching operation). The quenching circuit 202 may be, for example, a resistive element or an active quenching circuit configured to actively suppress avalanche amplification by detecting an increase in avalanche current to perform feedback control. The input node of a waveform shaper 203 (described below) is connected to the node between the photoelectric converter 201 and the quenching circuit 202. The quenching circuit 202 may be disposed between the anode of the photoelectric converter 201 and, for example, a ground that supplies the potential VL.

The pixel signal processing unit 102 includes the waveform shaper 203, a time-to-digital converter (TDC) 204, a memory 205, and a selection circuit 206.

The waveform shaper 203 shapes a waveform of changes in potential obtained during detection of photon-level signals to output a pulse signal. For example, an inverter circuit is used as the waveform shaper 203. Although a single inverter is used as the waveform shaper 203 in the present embodiment, a circuit formed by connecting a plurality of inverters in series, or a circuit having a waveform shaping effect, may be used as the waveform shaper 203.

The generation timing of the pulse signal output from the waveform shaper 203 is converted to a digital signal by the TDC 204.

For measuring the timing of the pulse signal, a control pulse pREF (reference signal) is supplied to the TDC 204 from the vertical scanning circuit unit 103 (see FIG. 1) through a drive line 207. With reference to the control pulse pREF, the TDC 204 acquires, as a digital signal, a signal obtained when the input timing of a signal output from each pixel 100 through the waveform shaper 203 is used as a relative time.

As a circuit of the TDC 204, for example, a delay-line circuit formed by connecting buffer circuits in series to produce a delay, or a looped-TDC circuit formed by connecting delay-line circuits into a loop, is used. Other types of circuits may also be used, as long as they can achieve a time resolution higher than or equal to that of the photoelectric converter 201. The digital signal acquired by the TDC 204 and representing the pulse detection timing is stored in one or more memories 205.

A control pulse pSEL is supplied from the vertical scanning circuit unit 103 (see FIG. 1) through a drive line 208 to the selection circuit 206 for switching on and off an electrical connection between the memory 205 and the signal line 107. As the selection circuit 206, for example, a transistor or a buffer circuit for outputting a signal to the outside of the pixel 100 is used.

When a plurality of memories 205 are provided, a plurality of signals are supplied to the selection circuit 206. This makes it possible to control, for each memory 205, the output of the digital signal stored in the memory 205 to the signal line 107.

An electrical connection may be switched by providing a switch, such as a transistor, between the quenching circuit 202 and the photoelectric converter 201 or between the light receiving unit 101 and the pixel signal processing unit 102. Similarly, the supply of the high potential VH to the quenching circuit 202 or the supply of the low potential VL to the photoelectric converter 201 may be electrically switched using a switch, such as a transistor.

The present embodiment is configured to acquire the pulse detection timing using the TDC 204 and the memory 205. Alternatively, the present embodiment may be configured to acquire a captured image using a counter circuit (not shown). The configuration in this case is as follows.

Pulse signals output from the waveform shaper 203 are counted by the counter circuit. For example, an N-bit counter circuit (where N is a positive integer) is capable of counting up to about the N-th power of two single-photon pulse signals. The counted signals are stored as detected signals. When the control pulse pREF is supplied through the drive line 207 to the counter circuit, the detected signals stored in the counter circuit are reset.

The detected signals stored in the counter circuit serve as signals for forming a captured image. Specifically, in the pixel unit 106 including the pixels 100 arranged in rows and columns, a captured image may be obtained by a rolling shutter operation which involves sequentially resetting the counts in the counter circuit row by row and sequentially outputting the detected signals stored in the counter circuit row by row. Alternatively, a captured image may be obtained by a global electronic shutter operation which involves simultaneously resetting the counts in the counter circuit for all pixel rows and sequentially outputting the detected signals stored in the counter circuit row by row.

In the case of performing the global electronic shutter operation, it is desirable that there be provided a switching unit for switching between the case where the counter circuit performs counting and the case where counter circuit does not perform counting. The switching unit is, for example, the switch described above.

With reference to FIGS. 3 to 6B, the photoelectric converter 201 of the pixel 100 for detecting signals based on avalanche-amplified electric charges will be described. Of the electric charge pairs generated by the photoelectric converter 201, electric charges used as signal charges are described as electrons in the present embodiment, but the signal charges may be holes.

Figure 3:
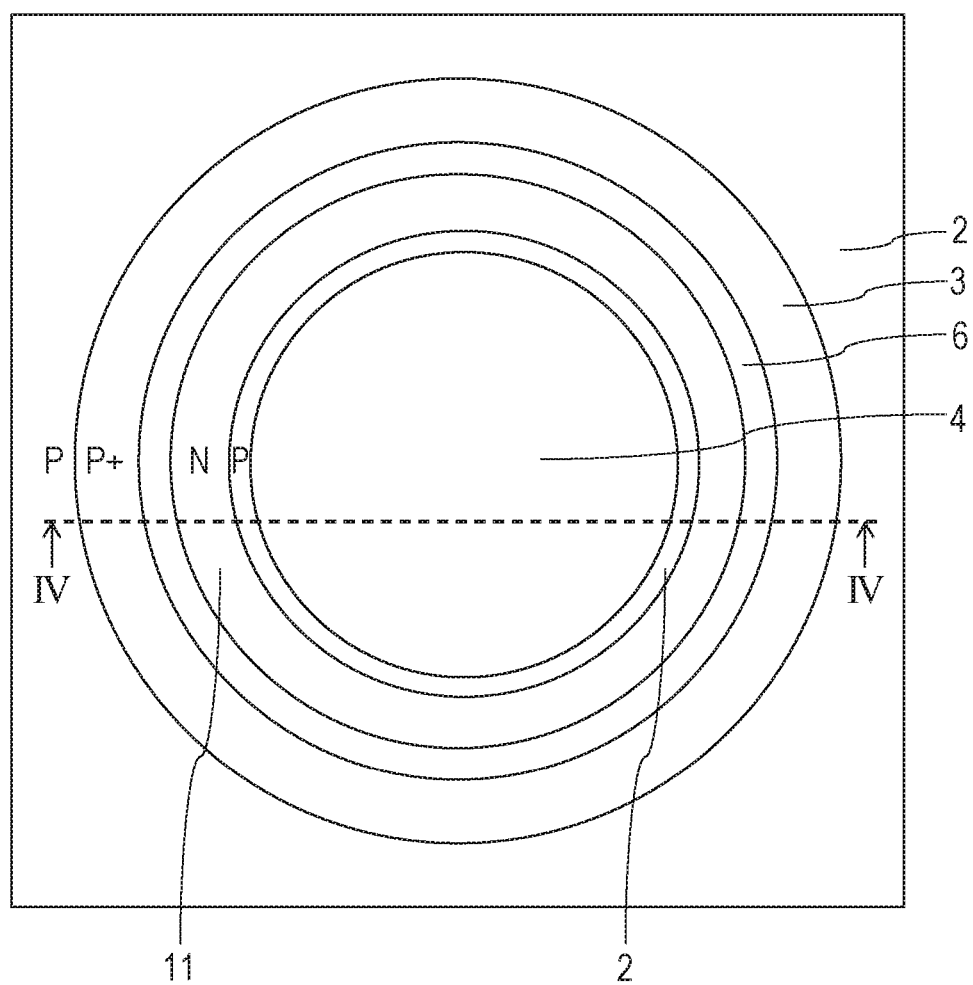
FIG. 3 is a schematic plan view of a photoelectric converter according to the embodiment.

FIG. 3 is a schematic plan view of the photoelectric converter 201 according to the present embodiment. In the photoelectric converter 201 according to the present embodiment, the N-type semiconductor region 11, the P-type semiconductor region 2, the P-type semiconductor region 3, and a separation portion 6 are arranged in a semiconductor substrate 15 (see FIG. 4), and an electrode 4 is disposed on the semiconductor substrate 15.

The P-type semiconductor region 2 is disposed to include the electrode 4 therein in plan view. The N-type semiconductor region 11 is disposed to include the P-type semiconductor region 2 therein in plan view. The separation portion 6 is disposed to include the N-type semiconductor region 11 therein in plan view. The P-type semiconductor region 3 is disposed to include the separation portion 6 therein in plan view. The P-type semiconductor region 2 is disposed to include the P-type semiconductor region 3 therein in plan view.

Although the N-type semiconductor region 11 is disposed to surround the entire periphery of the electrode 4 in plan view, it is only necessary that at least part of the entire periphery be surrounded.

It is desirable that the area of the electrode 4 be larger than the area of the N-type semiconductor region 11 in plan view. With this configuration, it is possible to increase the region for performing avalanche amplification between an inversion layer 10 and the P-type semiconductor region 2, and reduce the region for performing avalanche amplification between the N-type semiconductor region 11 and the P-type semiconductor region 2. By reducing the region for performing avalanche amplification between the N-type semiconductor region 11 and the P-type semiconductor region 2, it is possible to suppress avalanche amplification of unwanted electric charges generated by damage resulting from ion implantation for forming a semiconductor region. It is desirable that the N-type semiconductor region 11 be circular in plan view as in FIG. 3. With this shape, the occurrence of electric field concentration in corners can be avoided. The N-type semiconductor region 11 does not necessarily need to be circular, as long as the corners are rounded.

FIG. 4 is a schematic cross-sectional view of the photoelectric converter 201 according to the present embodiment, taken along line segment IV-IV in FIG. 3. The photoelectric converter 201 of the present embodiment includes the N-type semiconductor region 11, the P-type semiconductor region 2, the inversion layer 10, and the electrode 4 disposed on the semiconductor substrate 15. In the present embodiment, avalanche amplification occurs between the inversion layer 10 and the P-type semiconductor region 2, and may also occur between the N-type semiconductor region 11 and the P-type semiconductor region 2.

The semiconductor substrate 15 illustrated in FIG. 4 has a first surface and a second surface opposite the first surface. The first surface is the front surface of the semiconductor substrate 15, and the second surface is the back surface of the semiconductor substrate 15. In the present embodiment, the depth direction is a direction from the first surface toward the second surface.

In the semiconductor substrate 15, two portions of the N-type semiconductor region 11 and the P-type semiconductor region 2 are arranged in the region sandwiched by portions of the separation portion 6 in cross-sectional view. The N-type semiconductor region 11 is disposed on the first surface side of the semiconductor substrate 15. The P-type semiconductor region 2 is disposed in the region sandwiched by the two portions of the N-type semiconductor region 11 and at a position deeper than the N-type semiconductor region 11 with respect to the first surface. The N-type semiconductor region 11 and the P-type semiconductor region 2 form a PN junction. The P-type semiconductor region 2 is disposed under the electrode 4, to which a predetermined potential is supplied. Thus, the inversion layer 10 is formed in the P-type semiconductor region 2 and electrically connected to the N-type semiconductor region 11. In FIG. 4, the inversion layer 10 is formed in a region which is part of the P-type semiconductor region 2 and in the vicinity of the first surface. Note that "under the electrode 4" refers to a position overlapping the electrode 4 in plan view.

In the configuration of FIG. 4, the inversion layer 10 is connected to the two portions of the N-type semiconductor region 11. In this case, it is desirable that the two portions of the N-type semiconductor region 11 be configured to be at the same potential. Specifically, a conductive line 7 (described below) is connected to both of the two portions of the N-type semiconductor region 11, and the two portions of the N-type semiconductor region 11 are connected together in plan view.

The electrode 4 is disposed on the first surface of the semiconductor substrate 15, with a dielectric member 5 interposed therebetween. The electrode 4 is on the P-type semiconductor region 2 disposed to be sandwiched between the two portions of the N-type semiconductor region 11 in plan view or cross-sectional view. In plan view, a distance d between the N-type semiconductor region 11 and the electrode 4 is 0.1 µm or less.

The electrode 4 is made of, for example, N-type or P-type doped polysilicon or metal material. The dielectric member 5 is, for example, a silicon oxide film, a silicon nitride film, or a dielectric member containing fixed charges. Examples of the dielectric member containing fixed charges include a hafnium oxide ($HfO_2$) member, a zirconium oxide ($ZrO_2$) member, an aluminum oxide ($Al_2O_3$) member, a titanium oxide ($TiO_2$) member, and a tantalum oxide ($Ta_2O_5$) member.

Assume that the potential difference between the electrode 4 and the P-type semiconductor region 2 obtained when the dielectric member 5 is made of a material containing fixed charges is the same as the potential difference between the electrode 4 and the P-type semiconductor region 2 obtained when the dielectric member 5 is made of a material not containing fixed charges. In this case, by using a material containing fixed charges, the strength of an electric field applied between the electrode 4 and the P-type semiconductor region 2 can be increased. In other words, when the strength of an electric field between the electrode 4 and the P-type semiconductor region 2 is set to a predetermined value, if a material containing fixed charges is used to form the dielectric member 5, the potential difference between the electrode 4 and the P-type semiconductor region 2 can be reduced.

The P-type semiconductor region 2 illustrated in FIG. 4 has a uniform impurity concentration. Alternatively, the P-type semiconductor region 2 may have an impurity concentration gradient that provides a potential structure in which electric charges move toward the first surface of the semiconductor substrate 15.

For example, the P-type semiconductor region 2 may have an impurity concentration gradient such that the impurity concentration decreases from a deeper to shallower position with respect to the first surface of the semiconductor substrate 15. In this case, for example, the P-type semiconductor region 2 has a first sub-region, a second sub-region located at a position deeper than the first sub-region with respect to the first surface, and a third sub-region located at a position deeper than the second sub-region with respect to the first surface. The impurity concentration in the first sub-region (first impurity concentration), the impurity concentration in the second sub-region (second impurity concentration), and the impurity concentration in the third sub-region (third impurity concentration) have the following relationship: first impurity concentration<second impurity concentration<third impurity concentration.

With this configuration, the P-type semiconductor region 2 has an impurity concentration gradient that provides a potential structure in which electric charges move toward the first surface of the semiconductor substrate 15. With the third sub-region, it is possible to suppress leakage of electric charges which may occur in the pixels 100 when a plurality of pixels 100 are arranged in the same semiconductor substrate 15. Also, an impurity concentration in the P-type semiconductor region 2 is higher at the PN junction interface than an impurity concentration in a region deeper than the PN junction interface with respect to the first surface of the semiconductor substrate 15. Thus, by narrowing the width of a depletion layer at the PN junction, the strength of an electric field generated at the PN junction can be increased.

It is desirable that a P-type semiconductor region be not disposed at a position which is in contact with the first surface of the semiconductor substrate 15 and at which a PN junction is formed with the N-type semiconductor region 11 in cross-sectional view. If a P-type semiconductor region is disposed at a position in contact with the first surface of the semiconductor substrate 15, the N-type semiconductor region 11 and the P-type semiconductor region form a PN junction in the vicinity of the first surface, and electric charges generated on the front surface of the semiconductor substrate 15 may be avalanche-amplified. That is, when a P-type semiconductor region is not disposed at a position which is in contact with the first surface of the semiconductor substrate 15 and at which the N-type semiconductor region 11 and the P-type semiconductor region form a PN junction in cross-sectional view, it is possible to suppress avalanche amplification of unwanted electric charges generated on the front surface of the semiconductor substrate 15.

The P-type semiconductor region 3 is disposed in a region opposite the N-type semiconductor region 11, with the separation portion 6 interposed therebetween. The P-type semiconductor region 3 is electrically connected to the P-type semiconductor region 2. An impurity concentration in the P-type semiconductor region 3 is higher than an impurity concentration in the P-type semiconductor region 2. Therefore, by connecting the P-type semiconductor region 3 to a contact plug 14 (described below), a contact resistance can be made lower than that when the P-type semiconductor region 2 is connected to the contact plug 14.

A conductive line 9 supplies a potential through a contact plug 12 to the electrode 4. The conductive line 7 connects the N-type semiconductor region 11 to the quenching circuit 202 (see FIG. 2) through a contact plug 13. Through the conductive line 7 and the quenching circuit 202, a potential is supplied from the supply voltage (potential) VH to the N-type semiconductor region 11.

A conductive line 8 supplies a potential through the contact plug 14 to the P-type semiconductor region 3. Since the P-type semiconductor region 2 is electrically connected to the P-type semiconductor region 3, the potential supplied to the P-type semiconductor region 3 is also supplied to the P-type semiconductor region 2.

The quenching circuit 202 illustrated in FIG. 2 may be connected through the contact plug 14 to the P-type semiconductor region 3. In this case, the conductive line 7 supplies a potential from the supply voltage (potential) VH through the contact plug 13 to the N-type semiconductor region 11. In this case, it is desirable that the P-type semiconductor region 2, which is a well region, be electrically separated for each pixel 100. A change in the potential of the P-type semiconductor region 2, resulting from avalanche amplification, is output as a signal through the contact plug 14. Therefore, when the P-type semiconductor region 2 is electrically separated for each pixel 100, false detection of signals in adjacent pixels 100 can be reduced.

The conductive lines 7 and 9 may be connected to a common node. This can reduce the number of conductive lines for supplying a potential from the supply voltage (not shown) to the electrode 4, and increase the degree of freedom in layout.

Relationships between potentials for producing avalanche amplification will now be described. A potential which is the bias reverse of the potential supplied to the P-type semiconductor region 2 is supplied to the N-type semiconductor region 11. Thus, when the reverse bias is supplied to the photoelectric converter 201, an electric field is generated at the PN junction between the N-type semiconductor region 11 and the P-type semiconductor region 2. When a potential higher than or equal to that supplied to the N-type semiconductor region 11 is supplied to the electrode 4, the inversion layer 10 electrically connected to the N-type semiconductor region 11 is formed under the electrode 4.

In the present embodiment, a potential supplied to the N-type semiconductor region 11, a potential supplied to the P-type semiconductor region 2, and a potential supplied to the electrode 4 are set such that an electric field generated between the inversion layer 10 and the P-type semiconductor region 2 is sufficiently large. An electric field generated between the N-type semiconductor region 11 and the P-type semiconductor region 2 forming the PN junction may be sufficiently large.

Here, the "electric field is sufficiently large" means that an electric field that may cause the photoelectric converter 201 to produce avalanche amplification is applied between the N-type semiconductor region 11 and the P-type semiconductor region 2.

A potential which may form the inversion layer 10 under the electrode 4 is supplied to the electrode 4. In this case, a potential higher than that supplied to the P-type semiconductor region 2 is supplied to the electrode 4. This generates an electric field between the electrode 4 and the P-type semiconductor region 2. Then, in a semiconductor region in contact with the dielectric member 5 under the electrode 4, the inversion layer 10 is formed under the influence of the generated electric field. The inversion layer 10 is connected to the two portions of the N-type semiconductor region 11.

Figure 5A:
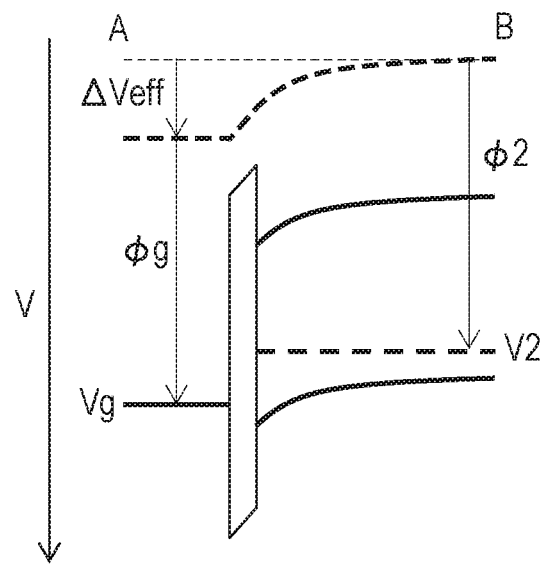
FIGS. 5A and 5B are energy band diagrams according to the embodiment.
Figure 5B:
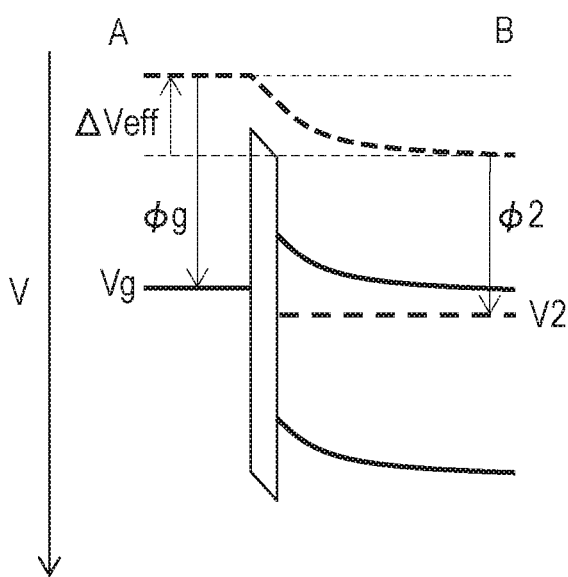

Conditions under which the inversion layer 10 is formed will now be described with reference to FIGS. 5A and 5B. FIGS. 5A and 5B are each a diagram of an energy band in a region along line segment AB in FIG. 4. FIG. 5A is a diagram of an energy band obtained when signal charges are electrons (electron amplification type), and FIG. 5B is a diagram of an energy band obtained when signal charges are holes (hole amplification type). In FIGS. 5A and 5B, a downward direction corresponds to the positive direction of a potential V. When the polarity of signal charges is reversed, an inequality sign in an inequality is reversed.

A potential Vg represents a potential supplied to the electrode 4, and a work function φg represents the work function of the electrode 4. A potential V2 represents a potential supplied to the P-type semiconductor region 2, and a work function φ2 represents the work function of the P-type semiconductor region 2. A difference $\Delta Veff=(\phi 2-\phi g)$ represents a difference in vacuum level obtained when the electrode 4 and the P-type semiconductor region 2 are in contact.

FIG. 5A illustrates a configuration in which the potential of the electrode 4 is higher than that of the P-type semiconductor region 2. A condition under which electrons generated in the semiconductor substrate 15 are attracted to the semiconductor region under the electrode 4 to form the inversion layer 10 in FIG. 5A is represented by inequality 1. Inequality 2 is obtained by modifying inequality 1.

$$(Vg-\phi g)-(V2-\phi 2)>0 \qquad \text{inequality 1}$$

$$(V2-\phi 2)<(Vg-\phi g) \qquad \text{inequality 2}$$

When the condition represented by inequality 2 is satisfied, electrons are attracted by an electric field generated between the electrode 4 and the P-type semiconductor region 2. When signal charges are holes, a region corresponding to the P-type semiconductor region 2 is an N-type semiconductor region. Therefore, a potential lower than that supplied to the N-type semiconductor region corresponding to the P-type semiconductor region 2 is supplied to the electrode 4.

The inversion layer 10 is formed under the electrode 4 by satisfying inequality 3:

$$V2-\phi 2<V11-\phi 11\leq Vg-\phi g \qquad \text{inequality 3}$$

where V11 is the potential of the N-type semiconductor region 11 and φ11 is the work function of the N-type semiconductor region 11.

As represented by inequality 3, when the potential Vg is sufficiently large and the semiconductor region under the electrode 4 is in a strongly inverted state, electrons are densely accumulated under the electrode 4 to form the inversion layer 10.

Figure 6A:
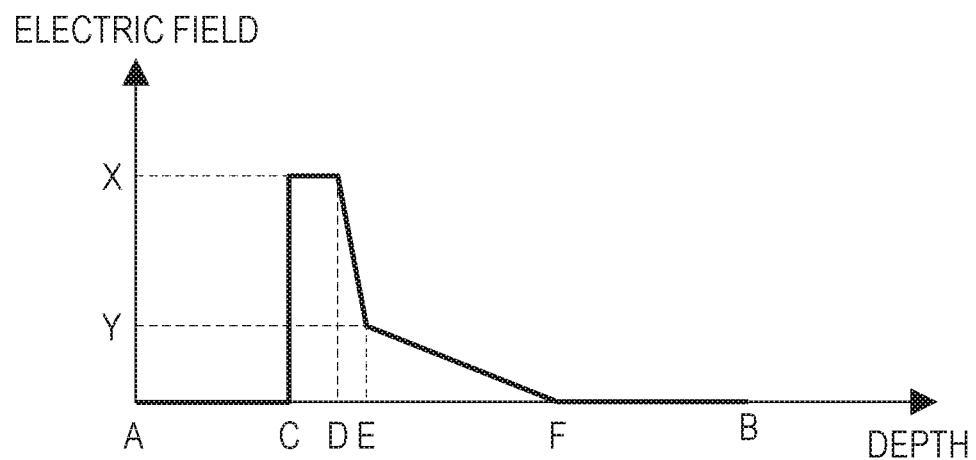
FIGS. 6A and 6B each illustrate an electric field distribution in a photoelectric converter.
Figure 6B:
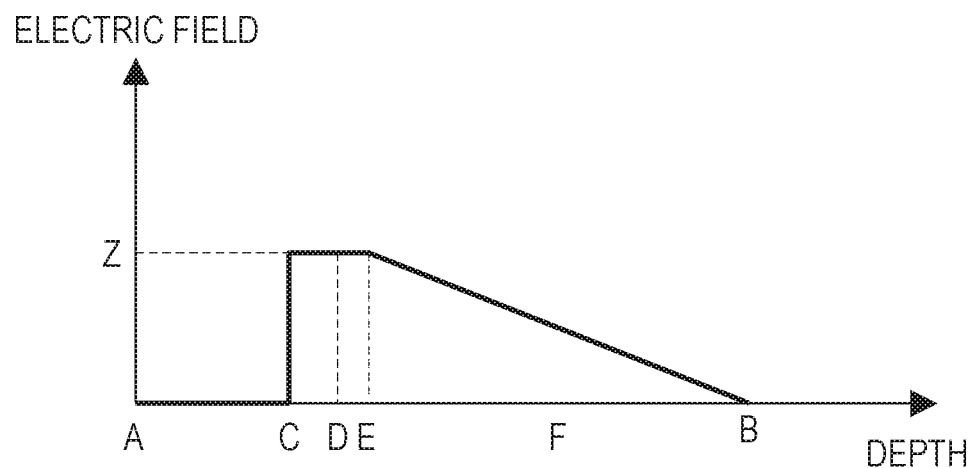

With reference to FIGS. 6A and 6B, an electric field distribution in line segment AB in FIG. 4 will be schematically described. The definition of each of depths (A, B, C, D, E, and F) in FIG. 4 and the definition of each of electric field strengths (level X, level Y, and level Z) will be described below.

Depth A represents a given position at which the electrode 4 is disposed. Depth C represents an interface between the dielectric member 5 and the electrode 4, and depth D represents an interface between the dielectric member 5 and the semiconductor substrate 15. Depth E represents an end of the inversion layer 10 in the depth direction. Depth F is a given depth deeper than depth E with respect to the first surface of the semiconductor substrate 15, and depth B is a given depth deeper than depth F with respect to the first surface of the semiconductor substrate 15.

Level X represents an electric field strength greater than level Z. Level Z represents an electric field strength greater than level Y.

FIG. 6A illustrates an electric field distribution according to a comparative example. Specifically, FIG. 6A illustrates an electric field distribution in a configuration where inequality 3 (described above) is satisfied, the inversion layer 10 and the two portions of the N-type semiconductor region 11 are electrically connected, and the potential V11 of the N-type semiconductor region 11 is floating. The configuration of this comparative example has the same problem as that occurs in the photodetection device disclosed in Japanese Patent Laid-Open No. 2008-288326 (described above).

FIG. 6B illustrates an electric field distribution according to the present embodiment. Specifically, FIG. 6B illustrates an electric field distribution in a configuration where inequality 3 (described above) is satisfied, the inversion layer 10 and the two portions of the N-type semiconductor region 11 are electrically connected, and the potential V11 of the N-type semiconductor region 11 changes to a potential V1. When the potential V11 of the N-type semiconductor region 11 changes to the potential V1, a potential difference that can produce avalanche amplification between the N-type semiconductor region 11 and the P-type semiconductor region 2 is created.

First, the comparative example illustrated in FIG. 6A will be described. Referring to FIG. 6A, the electric field strength at depth C-D between the electrode 4 and the P-type semiconductor region 2 is at level X. At depth D-E where the inversion layer 10 is disposed, the electric field strength abruptly weakens from level X to level Y. At depth E-F where the depletion layer extends, the electric field strength gradually weakens.

At depth C-D in FIG. 6A, an electric field that can produce avalanche amplification is applied between the electrode 4 and the P-type semiconductor region 2. However, at depth D-E, the electric field strength abruptly weakens. The reason for which the electric field weakens at depth D-E is that since the potential V11 of the N-type semiconductor region 11 is floating, even when the potential Vg supplied to the electrode 4 is increased, the charge density in the inversion layer 10 is increased in conjunction therewith. As a result, the electric field is blocked at depth D-E. The width d (i.e., distance in the depth direction) of the inversion layer 10 is longer than the width d of the dielectric member 5. Since an electric field E is represented by $\Delta V/d$, an electric field induced in the inversion layer 10 is less likely to strengthen.

When the potential Vg is increased, the electric field at depth C-D strengthens. However, since the electric field is blocked and abruptly weakened in the inversion layer 10 at depth D-E, the electric field in the depletion layer at depth E-F is less likely to strengthen. Accordingly, when the potential Vg is increased to maintain an electric field that is strong enough to produce avalanche amplification between the inversion layer 10 and the P-type semiconductor region 2, the electric field between the electrode 4 and the inversion layer 10 is further strengthened and the dielectric member 5 may be damaged.

In FIG. 6B corresponding to the configuration of the present embodiment, it is possible to generate an electric field strong enough to produce avalanche amplification between the inversion layer 10 and the P-type semiconductor region 2 while suppressing an electric field applied to the dielectric member 5.

Referring to FIG. 6B, the electric field strength at depth C-D between the electrode 4 and the inversion layer 10 is at level Z, and the strength of an electric field induced at depth D-E where the inversion layer 10 is disposed is also at about level Z. At depth E-B where the depletion layer extends, the electric field strength gradually weakens.

At depth C-D in FIG. 6B, where the potential of the inversion layer 10 is V1, the potential difference between the electrode 4 and the inversion layer 10 is reduced and an electric field applied to the dielectric member 5 becomes weaker than that in FIG. 6A.

At depth D-E, the inversion layer 10 is electrically connected to the N-type semiconductor region 11 and the potential of the inversion layer 10 and the potential V11 of the N-type semiconductor region 11 become the same (V1). Therefore, the potential difference between the P-type semiconductor region 2 and the inversion layer 10 in the configuration of FIG. 6B is larger than that in the configuration of FIG. 6A. It is thus possible to generate an electric field that can produce avalanche amplification between the inversion layer 10 and the P-type semiconductor region 2 while weakening the electric field applied to the dielectric member 5.

That is, unlike the case in which the potential V11 of the N-type semiconductor region 11 is floating, when the potential V11 changes to the potential V1, it is possible to maintain the strength of the electric field between the inversion layer 10 and the P-type semiconductor region 2 while reducing the electric field induced in the dielectric member 5.

A path from the inversion layer 10 to the N-type semiconductor region 11 is an electrical path for outputting a current based on electric charges avalanche-amplified under the influence of the strong electric field between the inversion layer 10 and the P-type semiconductor region 2.

In the configuration described here as an example, the electric field at depth C-D is substantially the same as that at depth D-E. However, it is only necessary that the electric field at depth E in FIG. 6B be stronger than the electric field at depth E in FIG. 6A.

The length (depth E-B) of the depletion layer in FIG. 6B is longer than the length (depth E-F) of the depletion layer in FIG. 6A. This is because the potential difference between the P-type semiconductor region 2 and the inversion layer 10 in the configuration of FIG. 6B is larger than that in the configuration of FIG. 6A. Thus, in the configuration of FIG. 6B, the electric field can have an influence on electrons generated at a position deeper than that in the configuration of FIG. 6A.

With the configuration of the present embodiment, the potential of the inversion layer 10 can be controlled by changing the potential V11 of the N-type semiconductor region 11 electrically connected to the inversion layer 10 under the electrode 4 to the potential V1.

FIGS. 6A and 6B show that, as compared to the case where the potential V11 of the N-type semiconductor region 11 is floating, when the potential V11 of the N-type semiconductor region 11 is changed to the potential V1, the potential difference between the inversion layer 10 and the gate electrode is smaller and the electric field generated in the dielectric member 5 is weaker.

That is, it is possible to suppress the electric field concentration in the dielectric member 5 while maintaining an electric field that is strong enough to produce avalanche amplification in the semiconductor substrate 15 under the electrode 4.

The present embodiment is applicable to either a front-illuminated type in which light is incident from the first surface, or to a back-illuminated type in which light is incident from the second surface. However, in the front-illuminated type, which is illuminated from above the electrode 4, light may be partly absorbed by the electrode 4. On the other hand, in the back-illuminated type, which is illuminated from under the electrode 4, the efficiency of charge-voltage conversion can be improved.

When avalanche amplification takes place, infrared emission occurs. This means that by measuring whether infrared emission occurs between the inversion layer 10 and the P-type semiconductor region 2 under the electrode 4, it is possible to determine whether avalanche amplification occurs between the inversion layer 10 and the P-type semiconductor region 2. Similarly, by measuring whether infrared emission occurs between the N-type semiconductor region 11 and the P-type semiconductor region 2, it is possible to determine whether avalanche amplification occurs between the N-type semiconductor region 11 and the P-type semiconductor region 2.

EXAMPLE 1

Figure 7:
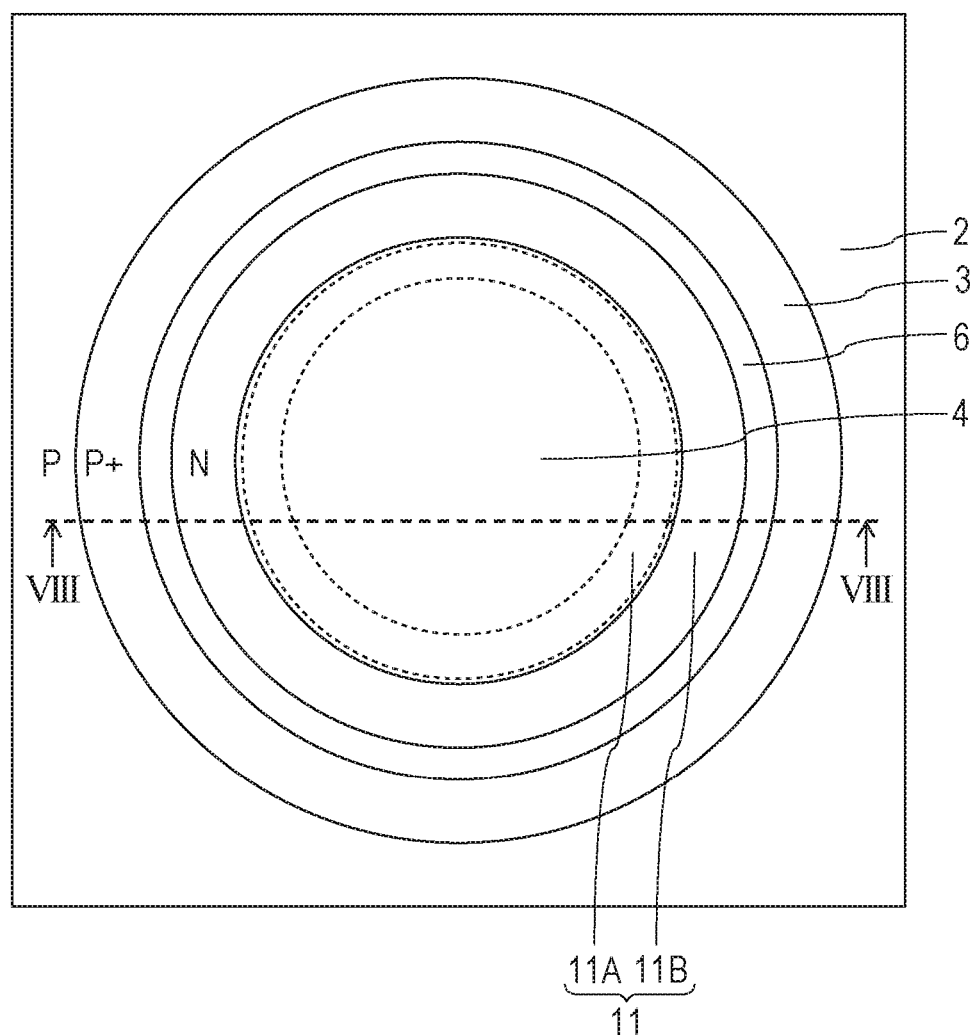
FIG. 7 is a schematic plan view of a photoelectric converter according to Example 1.
Figure 8:
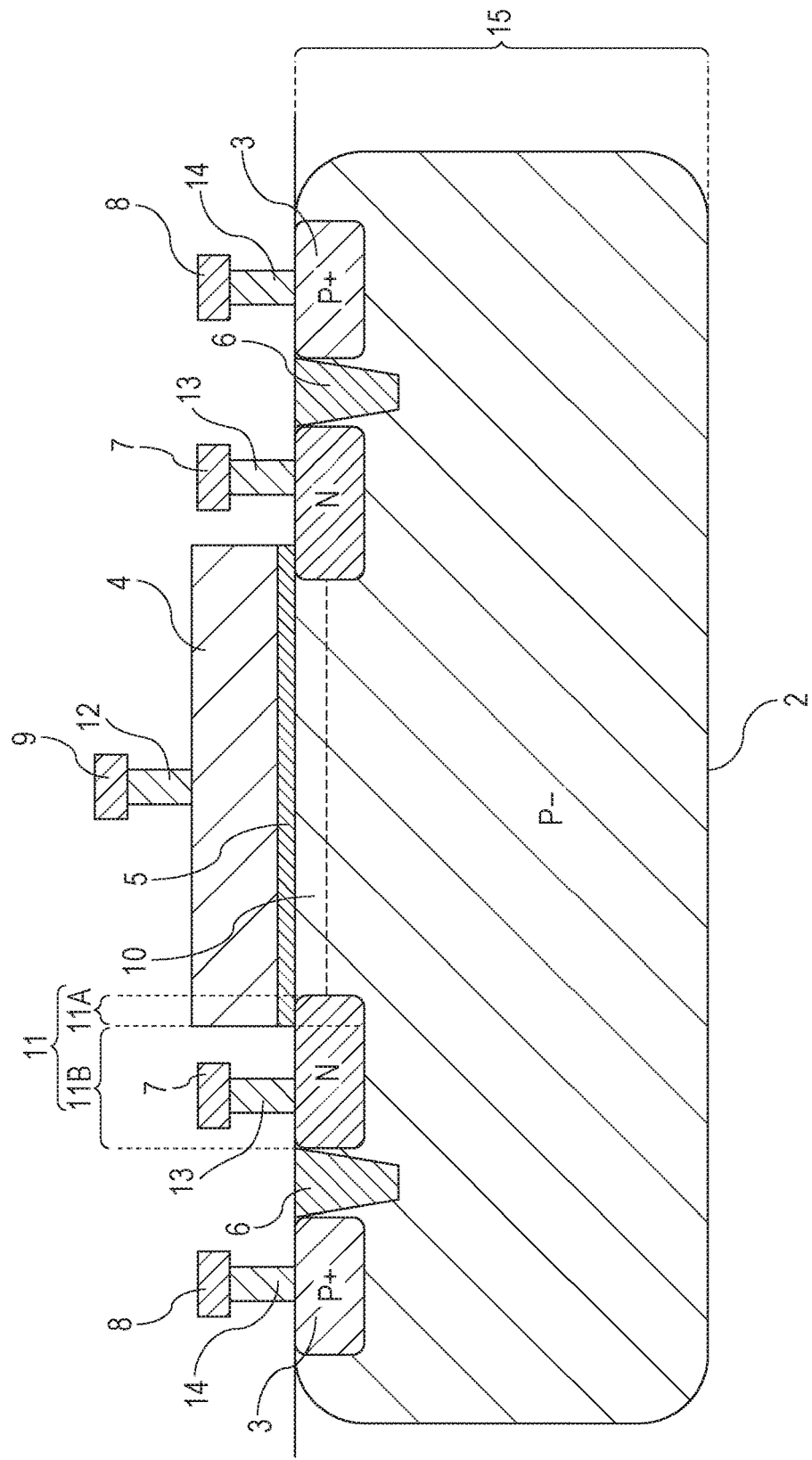
FIG. 8 is a schematic cross-sectional view of the photoelectric converter illustrated in FIG. 7.

With reference to FIGS. 7 and 8, the photodetection device 1010 and the photoelectric converter 201 according to Example 1 of the disclosure will be described. Components having the same functions as those illustrated in FIGS. 1 to 6B are denoted by the same reference numerals and their detailed description will be omitted.

FIGS. 7 and 8 are a schematic plan view and a schematic cross-sectional view, respectively, of the photoelectric converter 201 according to Example 1. Example 1 is characterized in that part of the N-type semiconductor region 11 is disposed under the electrode 4.

FIG. 7 is a schematic plan view of the photoelectric converter 201 according to Example 1. In the photoelectric converter 201 of Example 1, the N-type semiconductor region 11, the P-type semiconductor region 2, the P-type semiconductor region 3, and the separation portion 6 are arranged in the semiconductor substrate 15, and the electrode 4 is disposed on the semiconductor substrate 15. The N-type semiconductor region 11 has a first sub-region 11A and a second sub-region 11B. In plan view, the first sub-region 11A overlaps the electrode 4, whereas the second sub-region 11B does not overlap the electrode 4 and is disposed to include the electrode 4 therein.

Although the second sub-region 11B is disposed to surround the entire periphery of the electrode 4 in plan view, it is only necessary that at least part of the entire periphery be surrounded. Although the entire periphery of the electrode 4 is disposed to overlap the first sub-region 11A in plan view, it is only necessary that at least part of the entire periphery overlap the first sub-region 11A.

FIG. 8 is a schematic cross-sectional view of the photoelectric converter 201 taken along line segment VIII-VIII in FIG. 7. Referring to FIG. 8, the N-type semiconductor region 11 has the first sub-region 11A disposed under the electrode 4 and the second sub-region 11B not disposed under the electrode 4.

In Example 1, an impurity concentration in the N-type semiconductor region 11 is set to a value which does not cause depletion of the entire N-type semiconductor region 11 when a potential difference which can produce avalanche amplification is supplied to the PN junction. Specifically, the impurity concentration in the N-type semiconductor region 11 is $6.0 \times 10^{18}$ (atoms/cm$^3$) or more, and the impurity concentration in the P-type semiconductor region 2 is $5.0 \times 10^{16}$ (atoms/cm$^3$) or more. This is because if a depletion layer region extends to be in contact with the first surface of the semiconductor substrate 15, noise may be generated on the first surface of the semiconductor substrate 15. The impurity concentrations in the N-type semiconductor region 11 and the P-type semiconductor region 2 are not limited to the values described above.

In Example 1, the N-type semiconductor region 11 has the first sub-region 11A disposed under the electrode 4. This configuration facilitates electrical connection between the inversion layer 10 and the N-type semiconductor region 11.

The configuration of Example 1 also makes it possible to suppress the electric field concentration in the dielectric member 5 while maintaining an electric field that is strong enough to produce avalanche amplification in the semiconductor region under the electrode 4.

EXAMPLE 2

Figure 9:
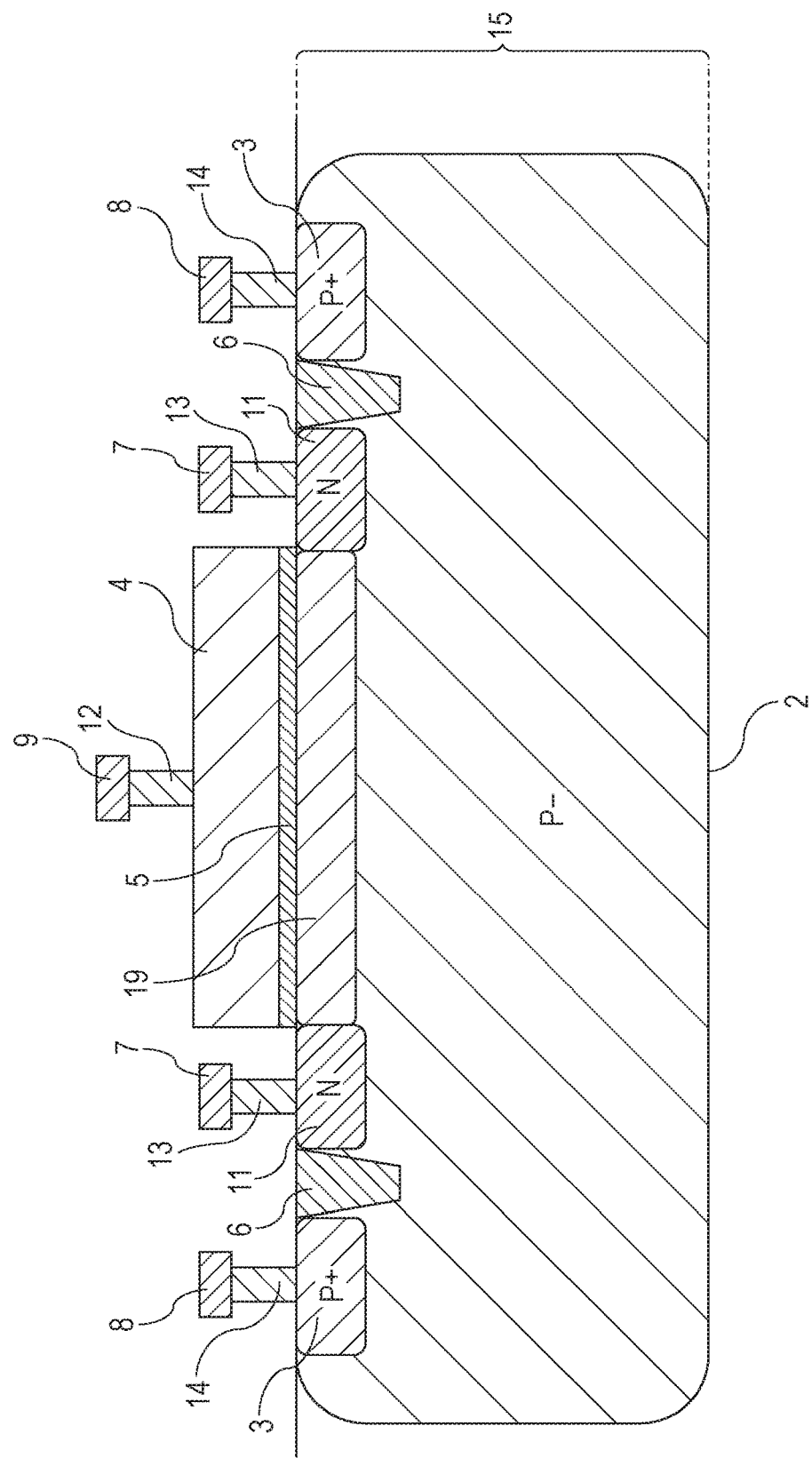
FIG. 9 is a schematic cross-sectional view of a photoelectric converter according to Example 2.

The photoelectric converter 201 according to Example 2 will be described with reference to the schematic cross-sectional view of FIG. 9. Components having the same functions as those illustrated in FIGS. 1 to 8 are denoted by the same reference numerals and their detailed description will be omitted.

Example 2 is characterized in that a P-type semiconductor region 19 having an impurity concentration higher than that in the P-type semiconductor region 2 is formed in the semiconductor region under the electrode 4.

When the inversion layer 10 is formed in the semiconductor region under the electrode 4, the strength of an electric field generated in the semiconductor region under the electrode 4 depends on the width of the depletion layer in the depth direction of the semiconductor substrate 15 under the electrode 4.

The width of the depletion layer varies depending on the impurity concentration in the semiconductor region under the electrode 4. Specifically, the higher the impurity concentration in the semiconductor region under the electrode 4, the smaller the width of the depletion layer and the stronger the strength of the electric field generated under the electrode 4.

Therefore, with the configuration of Example 2, where the P-type semiconductor region 19 having an impurity concentration higher than that in the P-type semiconductor region 2 is disposed in the semiconductor region under the electrode 4, the strength of the electric field induced under the electrode 4 can be increased.

It is desirable that the strength of the electric field between the inversion layer 10 and the P-type semiconductor region 2 be greater than or equal to the strength of the electric field generated between the N-type semiconductor region 11 and the P-type semiconductor region 3. This is because if the strongest electric field is generated at an end portion of the region where a strong electric field is generated, a tunnel current between bands caused by electric field concentration is increased and this may cause an increase in dark signal.

The configuration of Example 2 also makes it possible to suppress the electric field concentration in the dielectric member 5 while maintaining an electric field that is strong enough to produce avalanche amplification in the semiconductor substrate 15 under the electrode 4.

The configuration of Example 2 is also applicable to Example 1.

EXAMPLE 3

Figure 10:
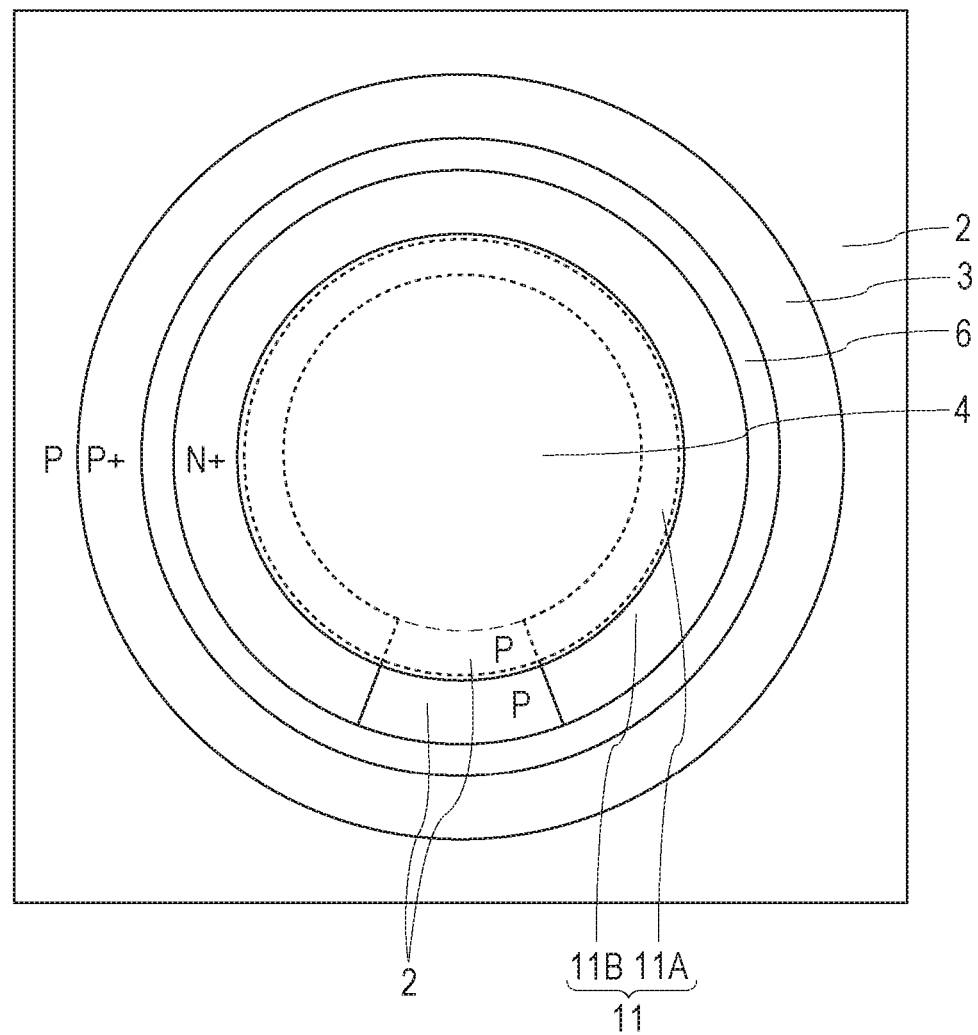
FIG. 10 is a schematic plan view of a photoelectric converter according to Example 3.

The photoelectric converter 201 according to Example 3 will be described with reference to FIG. 10. FIG. 10 is a schematic plan view of the photoelectric converter 201 in the light receiving unit 101 illustrated in FIG. 2. A schematic cross-sectional view corresponding to FIG. 10 is the same as that of Example 1 illustrated in FIG. 8, but is not limited to this.

Example 3 is characterized in that, in plan view, the P-type semiconductor region 2 is disposed along part of the periphery of the electrode 4 and the N-type semiconductor region 11 is disposed along the other part of the periphery of the electrode 4.

When a plurality of photoelectric converters 201 are arranged in an array, the N-type semiconductor regions 11 of adjacent photoelectric converters 201 need to be electrically separated. Therefore, if the N-type semiconductor region 11 is disposed along the entire periphery of the electrode 4 in plan view, the P-type semiconductor region 2 needs to surround the N-type semiconductor region 11 disposed along the entire periphery of the electrode 4. Since a sufficient distance between the photoelectric converters 201 needs to be ensured in this case, it is difficult to finely arrange the photoelectric converters 201.

In the configuration of Example 3, the P-type semiconductor region 2 is disposed along part of the entire periphery of the electrode 4 in plan view. That is, since the semiconductor region disposed along part of the entire periphery of the electrode 4 is the P-type semiconductor region 2, there is no need to provide the P-type semiconductor region 2 for the purpose of electrically separating the N-type semiconductor regions 11 in adjacent photoelectric converters 201.

Therefore, the area of the P-type semiconductor region 2 required for electrically separating the N-type semiconductor regions 11 in adjacent pixels 100 can be made smaller than that in the case of disposing the N-type semiconductor region 11 along the entire periphery of the electrode 4.

It is desirable that the N-type semiconductor region 11 be disposed along more than half of the entire periphery of the electrode 4 in plan view. This is because due to an electric field concentration between the end portion of the electrode 4 and the P-type semiconductor region 2, aliasing caused by an increase in tunnel current between bands may be increased.

The configuration of Example 3 improves the degree of freedom in layout and makes it easier to finely arrange the photoelectric converters 201.

The configuration of Example 3 also makes it possible to suppress the electric field concentration in the dielectric member 5 while maintaining an electric field that is strong enough to produce avalanche amplification in the semiconductor substrate 15 under the electrode 4.

Although the P-type semiconductor region 2 overlaps part of the periphery of the electrode 4 in plan view, the region that overlaps part of the periphery of the electrode 4 may be any P-type semiconductor region having an impurity concentration lower than that in the P-type semiconductor region 3. With the P-type semiconductor region having an impurity concentration lower than that in the P-type semiconductor region 3 having a high impurity concentration, it is possible to suppress the occurrence of aliasing resulting from an increase in tunnel current between bands that can be caused by an electric field concentration at the end portion of the electrode 4.

The configuration of Example 3 is also applicable to Examples 1 and 2.

EXAMPLE 4

The photoelectric converter 201 according to Example 4 will be described with reference to FIG. 11. In Example 4, the photoelectric converter 201 includes two N-type semiconductor regions 11 electrically connected together, and the electrode 4 is disposed to be sandwiched between the two N-type semiconductor regions 11 in plan view. The P-type semiconductor region 2 is disposed along part of the periphery of the electrode 4 in plan view, and the two N-type semiconductor regions 11 are disposed along the other part of the periphery of the electrode 4.

Figure 11:
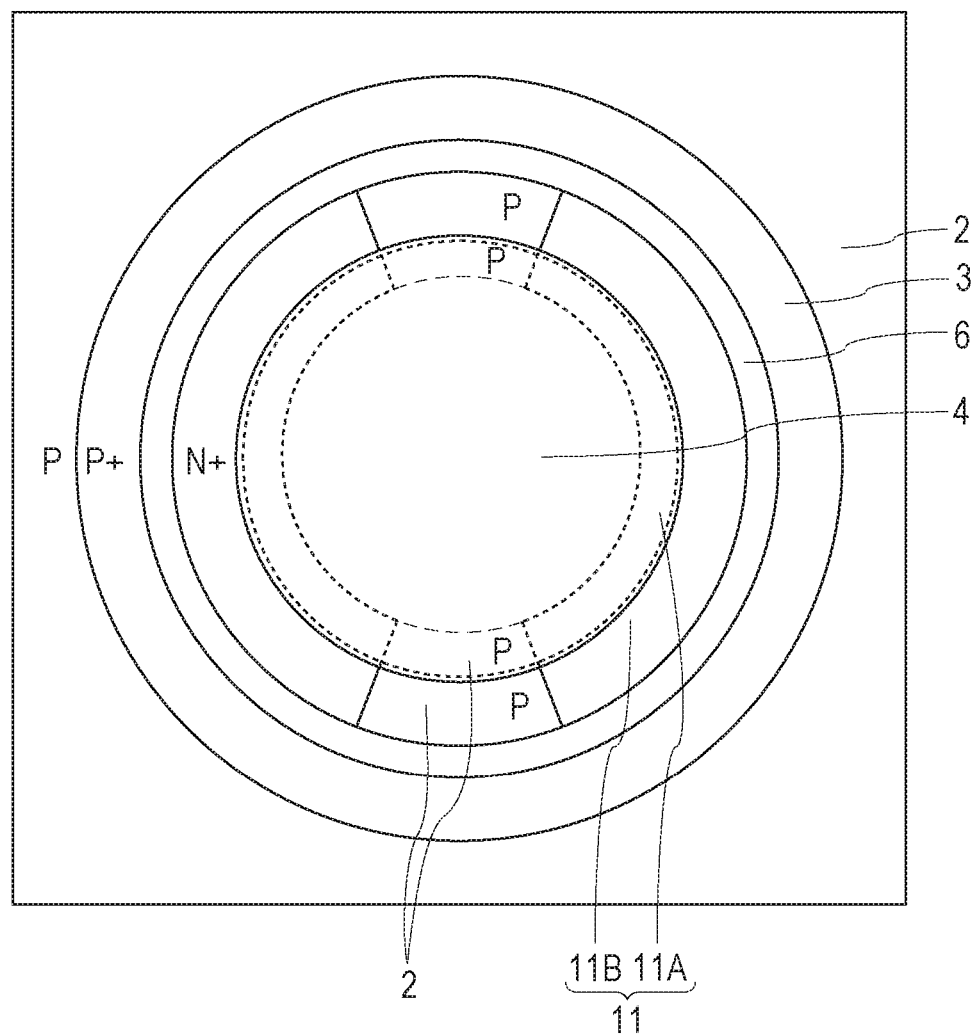
FIG. 11 is a schematic plan view of a photoelectric converter according to Example 4.

The photoelectric converter 201 illustrated in FIG. 11 includes the two N-type semiconductor regions 11 electrically connected together. It is desirable that the two N-type semiconductor regions 11 be connected to a common conductive line.

With the configuration of Example 4 where a plurality of N-type semiconductor regions 11 are arranged, it is possible to vary the speed of detection of electric charges. For example, when the two N-type semiconductor regions 11 are arranged on opposite sides, spatial nonuniformity in the speed of detection of electric charges can be reduced as compared to the case where one N-type semiconductor region 11 is disposed on only one side.

Additionally, as in the case of Example 3, the degree of freedom in layout is improved and this makes it easier to finely arrange the photoelectric converters 201.

The configuration of Example 4 also makes it possible to suppress the electric field concentration in the dielectric member 5 while maintaining an electric field that is strong enough to produce avalanche amplification in the semiconductor substrate 15 under the electrode 4.

The configuration of Example 4 is also applicable to Examples 1 and 2.

EXAMPLE 5

Figure 12:
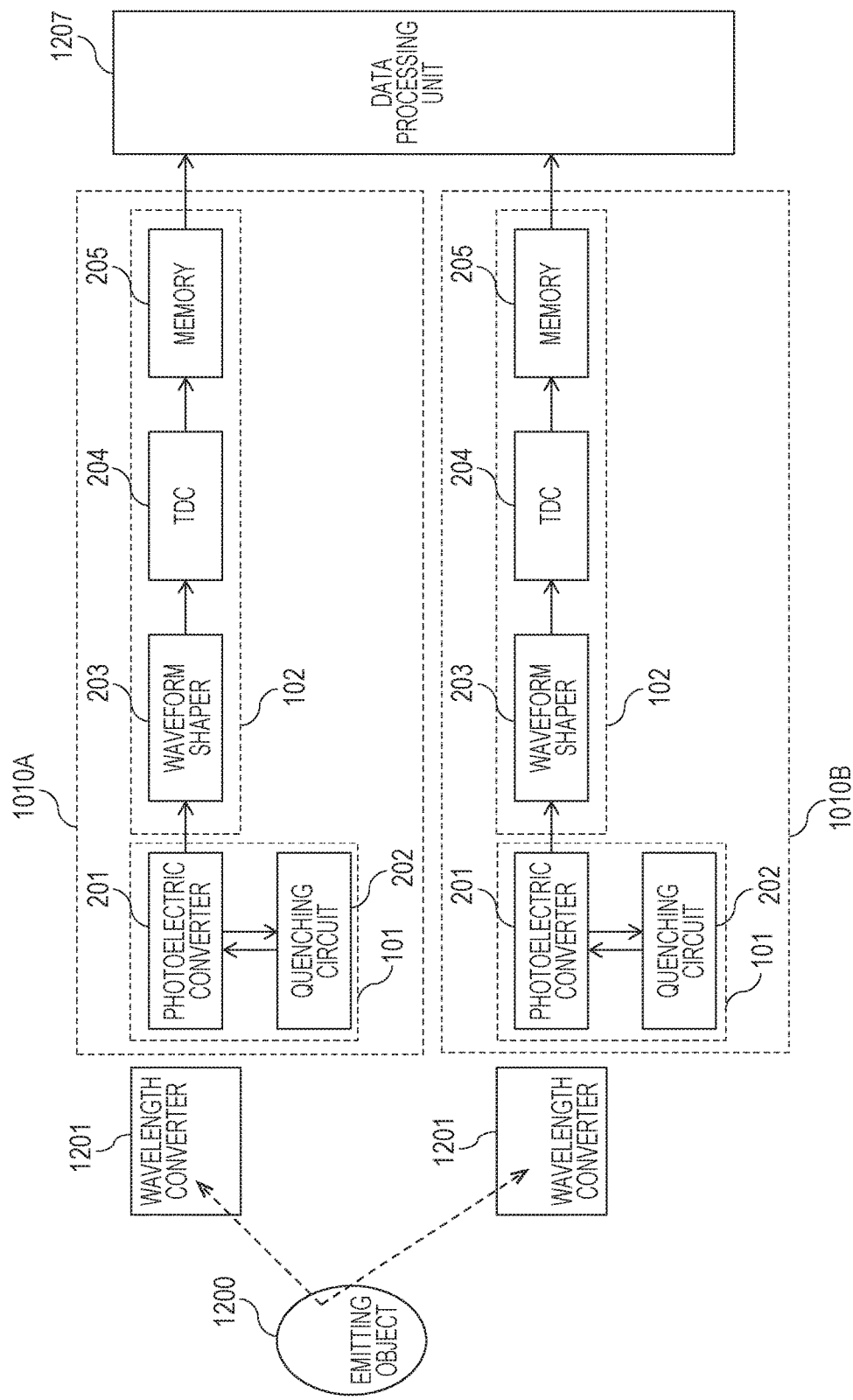
FIG. 12 is a block diagram of a photodetection system according to Example 5.

Example 5 describes a photodetection system including the photodetection device 1010 according to any one of the examples described above. With reference to FIG. 12, an invisible light detecting system and a medical diagnostic system such as a positron emission tomography (PET) system, which are examples of the photodetection system, will be described. Components having the same functions as those illustrated in FIGS. 1 to 11 are denoted by the same reference numerals and their detailed description will be omitted.

FIG. 12 is a block diagram illustrating a configuration of an invisible light detecting system. The invisible light detecting system includes a wavelength converter 1201, a data processing unit 1207, and a plurality of photodetection devices 1010 (1010A, 1010B).

An emitting object 1200 emits light in the wavelength range of invisible light. The wavelength converter 1201 receives the emitted light in the wavelength range of invisible light from the emitting object 1200 and emits visible light.

The visible light emitted from the wavelength converter 1201 is subjected to photoelectric conversion by the photoelectric converter 201. Then through the quenching circuit 202, the waveform shaper 203, and the TDC 204, the photodetection device 1010 stores, in the memory 205, a digital signal based on a signal based on electric charges obtained by the photoelectric conversion. The plurality of photodetection devices 1010 may be formed as a single device, or may be formed by arranging a plurality of devices.

A plurality of digital signals stored in the plurality of photodetection devices 1010 are subjected to signal processing by the data processing unit 1207. Here, the data processing unit 1207 serves as a signal processing unit configured to combine a plurality of images obtained from the plurality of digital signals.

Next, as a configuration of an exemplary invisible light detecting system, a configuration of a medical diagnostic system, such as a PET system, will be described.

A subject, which is the emitting object 1200, emits radiation pairs from its living body. The wavelength converter 1201 forms a scintillator, which emits visible light when receiving the radiation pairs emitted from the subject.

The visible light emitted from the scintillator is subjected to photoelectric conversion by the photoelectric converter 201. Then through the quenching circuit 202, the waveform shaper 203, and the TDC 204, the photodetection device 1010 stores, in the memory 205, a digital signal based on a signal based on electric charges obtained by the photoelectric conversion. That is, the photodetection device 1010 is provided to detect the time of arrival of radiation pairs emitted from the subject. The photodetection device 1010 detects visible light emitted from the scintillator, and stores a digital signal in the memory 205.

A plurality of digital signals stored in the plurality of photodetection devices 1010 are subjected to signal processing by the data processing unit 1207. Here, the data processing unit 1207 serves as a signal processing unit configured to reconstruct or combine a plurality of images obtained from the plurality of digital signals to form an internal image of the living body of the subject.

EXAMPLE 6

Example 6 describes a photodetection system including the photodetection device 1010 according to any one of the examples described above. Components having the same functions as those illustrated in FIGS. 1 to 11 are denoted by the same reference numerals and their detailed description will be omitted.

Figure 13:
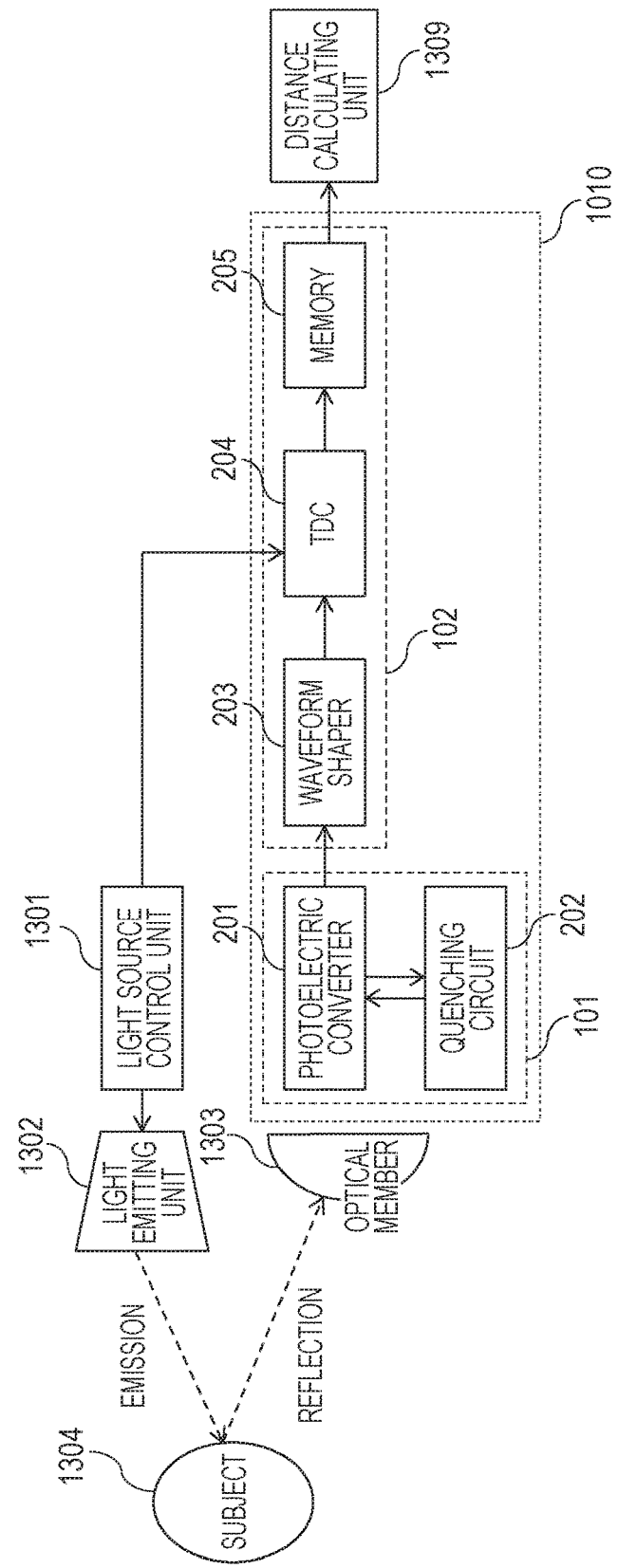
FIG. 13 is a block diagram of a photodetection system according to Example 6.

FIG. 13 is a block diagram of a distance detecting system, which is an example of the photodetection system. With reference to FIG. 13, the distance detecting system of Example 6 will be described. The distance detecting system includes a light source control unit 1301, a light emitting unit 1302, an optical member 1303, the photodetection device 1010, and a distance calculating unit 1309.

The light source control unit 1301 controls the drive of the light emitting unit 1302. When receiving a signal from the light source control unit 1301, the light emitting unit 1302 emits short pulses (columns) of light in the image capturing direction.

Light emitted from the light emitting unit 1302 is reflected off a subject 1304. The reflected light passes through the optical member 1303, and is received by the photoelectric converter 201 of the photodetection device 1010. A signal based on electric charges obtained by photoelectric conversion is transmitted through the waveform shaper 203 and input to the TDC 204.

The TDC 204 compares a signal obtained from the light source control unit 1301 with the signal input from the waveform shaper 203. Then the TDC 204 converts the time elapsed from the emission of pulsed light from the light emitting unit 1302 to the reception of light reflected off the subject 1304, into a digital signal with a high degree of precision. The digital signal output from the TDC 204 is stored in the memory 205.

The distance calculating unit 1309 calculates the distance from the photodetection device 1010 to the subject 1304 on the basis of digital signals obtained by multiple measurements and stored in the memory 205. For example, this distance detecting system can be mounted on a vehicle.

Figure 14A:
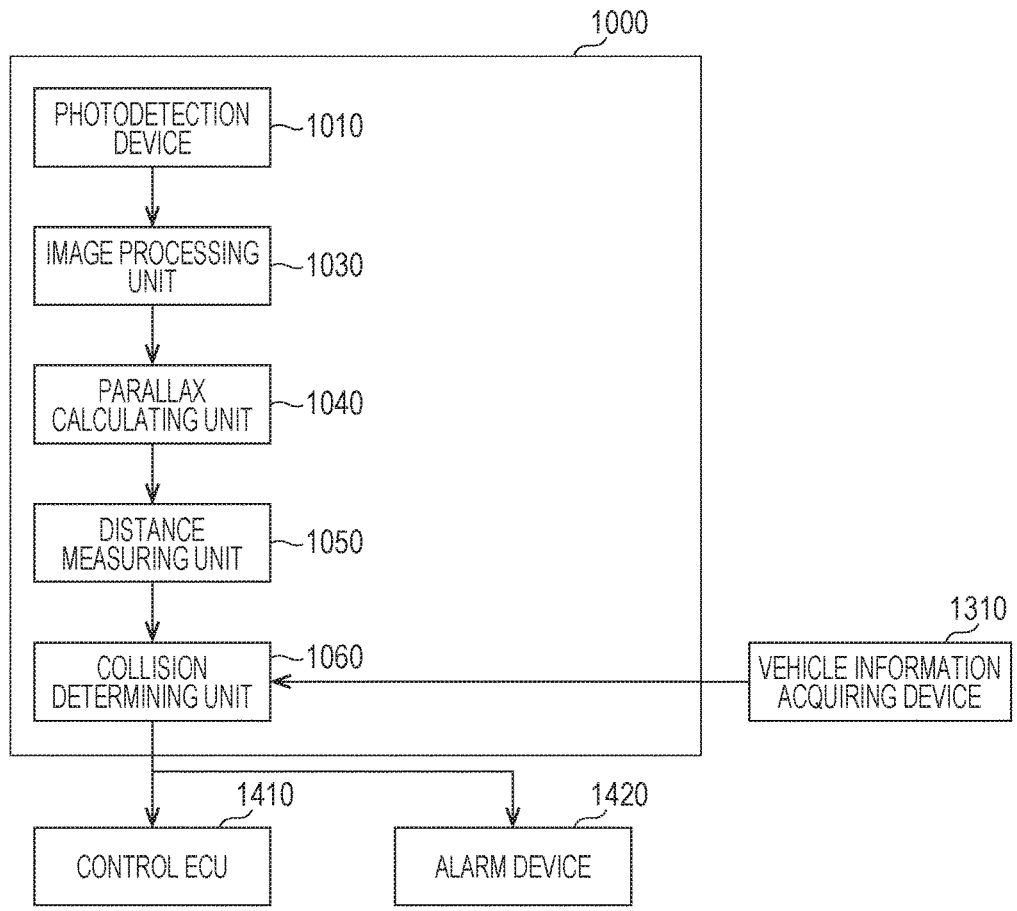
FIGS. 14A and 14B illustrate a photodetection system related to a vehicle-mounted camera according to Example 6.
Figure 14B:
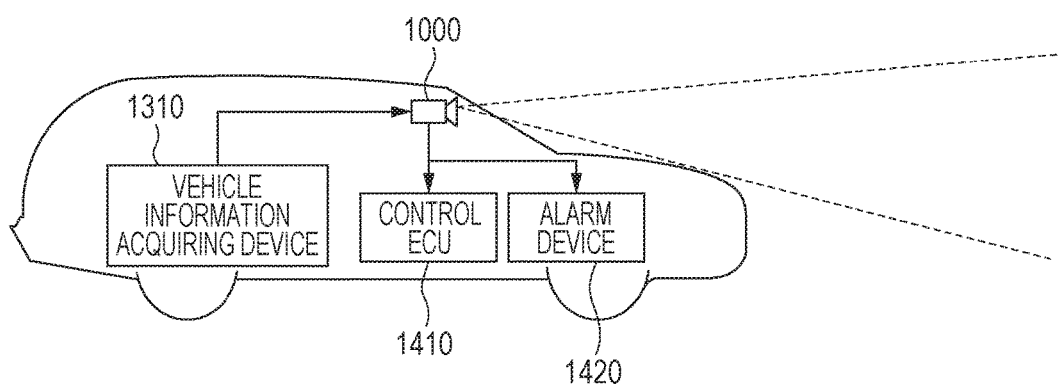

FIGS. 14A and 14B illustrate a photodetection system which includes a counter circuit, instead of the TDC 204 and the memory 205 in FIG. 2. With reference to FIGS. 14A and 14B, a photodetection system related to a vehicle-mounted camera will be described.

A photodetection system 1000 is a photodetection system that includes ranging pixels and imaging pixels. The photodetection system 1000 includes an image processing unit 1030 that performs image processing on a plurality of pieces of image data acquired by the photodetection device 1010. The photodetection system 1000 also includes a parallax calculating unit 1040 that calculates a parallax (i.e., phase difference between parallax images) from the plurality of pieces of image data acquired by the photodetection device 1010.

The photodetection system 1000 further includes a distance measuring unit 1050 that calculates a distance to an object on the basis of the calculated parallax, and a collision determining unit 1060 that determines the possibility of collision on the basis of the calculated distance. The parallax calculating unit 1040 and the distance measuring unit 1050 are examples of a distance information acquiring unit that acquires distance information about a distance to the object. That is, the distance information is information about a parallax, the amount of defocusing, a distance to the object, and the like.

The collision determining unit 1060 may determine the possibility of collision using any of the distance information described above. The distance information acquiring unit may be implemented by specifically-designed hardware, a software module, or a combination of both. The distance information acquiring unit may be implemented by a field programmable gate array (FPGA), an application specific integrated circuit (ASIC), or a combination of both.

The photodetection system 1000 is connected to a vehicle information acquiring device 1310 and can acquire vehicle information, such as a vehicle speed, a yaw rate, and a rudder angle. The photodetection system 1000 is also connected to a control ECU 1410 which is a control device that outputs a control signal for generating a braking force to a vehicle on the basis of the determination made by the collision determining unit 1060.

The photodetection system 1000 is also connected to an alarm device 1420 that gives an alarm to a vehicle driver on the basis of the determination made by the collision determining unit 1060. For example, if the collision determining unit 1060 determines that the possibility of collision is high, the control ECU 1410 performs vehicle control to avoid a collision or reduce damage by applying the brake, releasing the accelerator, or suppressing the engine output. The alarm device 1420 gives an alarm to the user, for example, by sounding an audio alarm, displaying alarm information on the screen of a car navigation system, or vibrating the seatbelt or steering wheel.

In the present example, the photodetection system 1000 captures an image of the surroundings of the vehicle, such as the front or rear of the vehicle. FIG. 14B illustrates a photodetection system used to capture an image of the front of the vehicle. Although a control operation for avoiding a collision with other vehicles has been described, the same configuration is also applicable to a self-driving control operation for following other vehicles, and to a self-driving control operation for not driving out of the lane. The photodetection system described above is applicable not only to vehicles, such as those having the photodetection system mounted thereon, but also to movable bodies (moving devices), such as ships, aircrafts, and industrial robots. The photodetection system is applicable not only to movable bodies, but is also widely applicable to devices using an object recognition technique, such as intelligent transport systems (ITSs).

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-231768 filed Nov. 29, 2016, which is hereby incorporated by reference herein in its entirety.

What is claimed is:

1. A photodetection device comprising:
a semiconductor substrate; and
a pixel including a first semiconductor region having signal charges as majority carriers, and a first electrode disposed on the semiconductor substrate with a dielectric member interposed therebetween, the pixel being configured to detect a signal based on avalanche-amplified electric charges,
wherein the pixel includes a second semiconductor region of a conductive type opposite that of the first semiconductor region, the second semiconductor region being disposed under the first electrode and in a front surface of the semiconductor substrate, and a second electrode disposed on the semiconductor substrate and configured to supply a potential to the second semiconductor region,
wherein when a predetermined potential is supplied between the first electrode and the second electrode, an inversion layer electrically connected to the first semiconductor region is formed in the second semiconductor region and
an avalanche amplification occurs at an interface between the inversion layer and the second semiconductor region.

2. The photodetection device according to claim 1, wherein in plan view, a distance between the first semiconductor region and the first electrode is 0.1 μm or less.

3. The photodetection device according to claim 1, wherein in plan view, a part of the first electrode overlaps a part of the first semiconductor region.

4. The photodetection device according to claim 1, wherein the second semiconductor region is disposed under the first semiconductor region, and the first semiconductor region and the second semiconductor region form a PN junction; and
a potential difference at the PN junction between a potential supplied to the first semiconductor region and a potential supplied to the second semiconductor region is higher than a breakdown voltage at the PN junction.

5. The photodetection device according to claim 4, wherein an impurity concentration in the second semiconductor region is higher at a portion of the second semiconductor region, the portion having the inversion layer formed therein, than at an interface of the PN junction.

6. The photodetection device according to claim 1, wherein the second semiconductor region is disposed under the first semiconductor region, and the first semiconductor region and the second semiconductor region form a PN junction; and
a potential difference at the PN junction between a potential supplied to the first semiconductor region and a potential supplied to the second semiconductor region is lower than or equal to a breakdown voltage at the PN junction.

7. The photodetection device according to claim 1, wherein a potential higher than or equal to a potential supplied to the first semiconductor region is supplied to the first electrode.

8. The photodetection device according to claim 1, wherein a conductive line connected to the first semiconductor region and a conductive line connected to the first electrode are connected to a common node.

9. The photodetection device according to claim 1, wherein the first electrode is disposed on a first side of the semiconductor substrate, and light is incident on the pixel from a second side of the semiconductor substrate opposite the first side.

10. The photodetection device according to claim 1, wherein a potential V1 supplied to the first semiconductor region, a potential V2 supplied to the second semiconductor region, a potential Vg supplied to the first electrode, a work function $\phi 1$ of the first semiconductor region, a work function $\phi 2$ of the second semiconductor region, and a work function $\phi g$ of the first electrode satisfy inequality 1 when the signal charges are electrons, and satisfy inequality 2 when the signal charges are holes:

$$V2-\phi 2 < V1-\phi 1 \leq Vg-\phi g \qquad \text{inequality 1}$$

$$V2-\phi 2 > V1-\phi 1 \geq Vg-\phi g \qquad \text{inequality 2.}$$

11. The photodetection device according to claim 1, wherein a potential of 6 V or higher is supplied to the first electrode and the first semiconductor region, and a potential of 0 V or lower is supplied to the second semiconductor region.

12. The photodetection device according to claim 1, wherein the area of the first electrode is larger than the area of the first semiconductor region.

13. The photodetection device according to claim 1, wherein the second semiconductor region is disposed along a part of an entire periphery of the first electrode, and the first semiconductor region is disposed along the other part of the entire periphery of the first electrode.

14. The photodetection device according to claim 13, wherein the pixel includes two first semiconductor regions electrically connected together; and
the first electrode is disposed to be sandwiched between the two first semiconductor regions.

15. The photodetection device according to claim 1, wherein the first semiconductor region is disposed along an entire periphery of the first electrode.

16. The photodetection device according to claim 1, wherein the pixel includes
a quenching circuit connected to the first semiconductor region and configured to suppress a current generated by the avalanche amplification;
a waveform shaper connected to a node to which the quenching circuit and the first semiconductor region are connected, the waveform shaper being configured to shape a waveform of changes in potential at the node to output a pulse signal; and
a digital conversion circuit connected to an output node of the waveform shaper, the digital conversion circuit being configured to output a digital signal based on the pulse signal output from the waveform shaper.

17. A photodetection system comprising:
a plurality of photodetection devices according to claim 1;
a wavelength converter configured to convert light in a first wavelength range to light in a second wavelength range different from the first wavelength range; and
a signal processing unit configured to combine a plurality of images obtained from a plurality of digital signals stored in the photodetection devices,
wherein the light in the second wavelength range output from the wavelength converter is incident on the photodetection devices.

18. A photodetection system comprising:
   the photodetection device according to claim 1;
   a light emitting unit configured to emit light detected by the photodetection device; and
   a distance calculating unit configured to calculate a distance using a digital signal stored in the photodetection device.

19. A photodetection device comprising:
   a semiconductor substrate; and
   a pixel including a first semiconductor region having signal charges as majority carriers, and an electrode disposed on the semiconductor substrate with a dielectric member interposed therebetween, the pixel being configured to detect a signal based on avalanche-amplified electric charges,
   wherein in plan view, a part of the electrode overlaps a part of the first semiconductor region, and the other part of the electrode overlaps a second semiconductor region of a conductive type opposite that of the first semiconductor region.

20. The photodetection device according to claim 19, wherein when a predetermined potential is supplied to the electrode, an inversion layer electrically connected to the first semiconductor region is formed in the second semiconductor region; and
   avalanche amplification occurs at an interface between the inversion layer and the second semiconductor region.

* * * * *